United States Patent [19]
Lu et al.

[11] Patent Number: 5,652,165
[45] Date of Patent: Jul. 29, 1997

[54] METHOD OF FORMING A STACKED CAPACITOR WITH A DOUBLE WALL CROWN SHAPE

[75] Inventors: Chih-Yuan Lu; Horng-Huei Tseng, both of Hsinchu, Taiwan

[73] Assignee: Vanguard International Semiconductor Corporation, Hsin-chu, Taiwan

[21] Appl. No.: 661,251

[22] Filed: Jun. 10, 1996

[51] Int. Cl.⁶ .................................................. H01L 21/8242
[52] U.S. Cl. ............................. 437/52; 437/60; 437/919
[58] Field of Search ............................... 437/47, 52, 60, 437/919

[56] References Cited

U.S. PATENT DOCUMENTS

| | | | |
|---|---|---|---|
| 5,185,282 | 2/1993 | Lee et al. | 437/47 |
| 5,438,010 | 8/1995 | Saeki | 437/52 |
| 5,476,806 | 12/1995 | Roh et al. | 437/52 |
| 5,491,103 | 2/1996 | Ahn et al. | 437/52 |

*Primary Examiner*—Jey Tsai
*Attorney, Agent, or Firm*—George O. Saile; William J. Stoffel

[57] ABSTRACT

The present invention provides a method of manufacturing a stacked capacitor having a double walled crown shape. The method begins by providing a field effect transistor adjacent to a field oxide region in a substrate. Next, a first insulating layer and a barrier layer is formed over the resultant surface. A node contact opening is then etched in the barrier layer and the first insulation layer exposing a source region of the transistor. A first conductive layer is formed in the node contact opening and covers the first silicon nitride layer. A masking block is then formed over at least the node contact hole. First conductive spacers are then formed on the sidewalls of the masking block. Nitride spacers are formed on the sidewalls of the first conductive spacers. Second conductive spacers are formed on the sidewalls of the nitride spacers. The first conductive layer is anisotropically etched using the cylinder block, first conductive spacers, and the dielectric spacers as a mask. The masking block and the nitride spacers are removed thereby forming a double wall crown shape bottom electrode. A capacitor dielectric layer and top plate are formed to complete the capacitor.

23 Claims, 11 Drawing Sheets

METHOD OF FORMING A STACKED CAPACITOR WITH A DOUBLE WALL CROWN SHAPE

BACKGROUND OF INVENTION

1) Field of the Invention

This invention relates generally to the fabrication of capacitors and more particularly to the fabrication of stacked capacitor arrays for a memory device.

2) Description of the Prior Art

A typical dynamic random access memory (DRAM) cell consists of a single transistor and a storage capacitor. Digital information is stored in the capacitor and accessed through the transistor, by the way of addressing the desired memory cell, which is connected with other such cells through an array of bit lines and word lines. In order to construct high density DRAMs in a reasonably sized chip area, both the transistor and capacitor element must occupy less lateral space in each memory cell.

As DRAMs are scaled down in dimensions, there is a continuous challenge to maintain a sufficiently high stored charge per capacitor unit area. In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairy constant rate. The issue of maintaining storage node capacitance is particularly important as the density of DRAM cells continues to increase for future generations of memory devices. The ability to densely pack storage cells while maintaining required storage capability is a crucial requirement of semiconductor manufacturing technologies if future generations of expanded memory array devices are to be successfully manufactured.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another, and methods of forming a capacitor using a hemispherical grain polysilicon (HSG) process using polysilicon grains.

A problem with current methods of fabricating stacked capacitors is that many photolithographic steps are used. The photo steps add cost and manufacturing complexity. Moreover, photolithographic processes require relatively large image tolerances which make the capacitor larger. To miniaturize the capacitor further processes must be developed with reduce the number of photolithographic steps.

Workers in the art are aware of the density and photolithographic limitation of present capacitors and have attempted to resolve them. U.S. Pat. No. 5,476,806 (Roh), U.S. Pat. No. 5,185,282 (Lee) and U.S. Pat. No. 5,491,103 (Ahn) disclose methods for forming crown type stacked capacitors. However, these methods and structures can be further optimized. Moreover, many of the other prior art methods require substantially more processing steps (especially photo steps) or/and planar structures which make the manufacturing process more complex and costly. Therefore, it is very desirable to develop processes that are as simple as possible and maximize the capacitance per unit area. There is a challenge to develop methods of manufacturing these capacitors that minimize the manufacturing costs and maximize the device yields. In particular, there is a challenge to develop a method which minimizes the number of photoresist operations and provides maximum process tolerance to maximize product yields.

SUMMARY OF THE INVENTION

It is an object of the present invention to provide a method for fabricating a DRAM having a capacitor with a high density and capacitance which is low cost and simple to manufacture.

It is an object of the present invention to provide a method for fabricating a stacked capacitor with a double wall crown shape which has fewer photolithographic and etch steps than the conventional processes.

It is an object of the present invention to provide a method for fabricating a stacked capacitor with a double wall crown shape which has a high capacitance per area.

To accomplish the above objectives, the present invention provides a method of manufacturing a crown capacitor having a double wall crown shape for a DRAM. The method begins by providing a MOS (metal oxide semiconductor) device having source and drain regions, adjacent to a field oxide region on which there is a conductive word line 16B, in a silicon substrate. Next, a first insulating layer 30A (e.g., oxide layer) is formed over the substrate 10. A barrier layer (e.g., silicon nitride or silicon oxide layer) 32A is then formed over the first insulation layer 30A. A node contact opening 33 is then etched in the barrier layer (e.g., silicon nitride layer 32A) and the first insulation layer 30A exposing the source region in the substrate 10. A first conductive layer 34 is formed in the node contact opening and covers the barrier layer 32A. A masking layer (e.g., nitride layer) 36 is formed over the first conductive layer 34. The masking layer 36 is patterned forming a masking block (masking cylinder) 36A over at least the node contact hole 33. A second conductive layer 38 (in situ doped poly) is formed over the surfaces of the masking block and the first conductive layer 34. The second conductive layer 38 is anisotropically etched forming first conductive spacers 38A on the sidewalls of the masking block (cylinder) 36A. A dielectric layer (e.g., oxide or nitride layer) 40 is then formed over the resultant surface. The dielectric layer 40 is anisotropically etched forming dielectric spacers 40A on the sidewalls of the first conductive spacers. A third conductive layer 42 is formed over the resultant surface. The third conductive layer 42 is anisotropically etched forming second polysilicon spacers 42A on the sidewalls of the dielectric spacers 40A. The first conductive layer 34 is anisotropically etched using the cylinder block 36A, first conductive spacers 38A, and the dielectric spacers 40A 42A as a mask thereby exposing the first barrier layer. The masking block 36A and the dielectric spacers 40A are removed using a selective etch thereby forming a bottom electrode 34A 38A 42A. A capacitor dielectric layer 50 is formed over the bottom electrode 34A 38A 42A. A top plate electrode 54 is formed over the capacitor dielectric layer 50 to form the stacked capacitor. Insulating layers and metallurgy layers are formed over the capacitor to complete the memory cell.

In a first embodiment of the present invention, the barrier layer 32A is composed of silicon nitride, and the masking layer 36 and the dielectric spacers 40A are composed of silicon oxide. In a second embodiment of the present invention, the barrier layer 32A is composed of silicon oxide, and the masking layer 36 and the dielectric spacers 40A are composed of silicon nitride.

The process of the invention provides a high capacitance double walled crown stacked capacitor which produces has a smooth topology. The two walls of the storage electrode increase the surface area and therefore the increase the capacitance. The process is simple to manufacture and the spacers and the first insulation layer 30 allow tight dimensional process control of the steps sizes. The invention provides a capacitor with increased capacitance without adding masking steps by using an unique spacer process.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of manufacturing a stacked capacitor for a DRAM having a double walled shape. The stacked capacitor has small dimensions, high capacitance and uses less photo steps. The process for forming the field oxide (FOX) and the field effect transistor structure as presently practiced in manufacturing DRAM cells are briefly described in order to better understand the current invention. The term "substrate" is mean to include devices formed within a semiconductor wafer, such as doped regions, and the layers overlying the wafer, such as insulation and conductive layers. The term "substrate surface" is meant to include the upper most exposed layers on a semiconductor wafer, such as a silicon surface, insulating layers and conductive lines.

Figure 1:
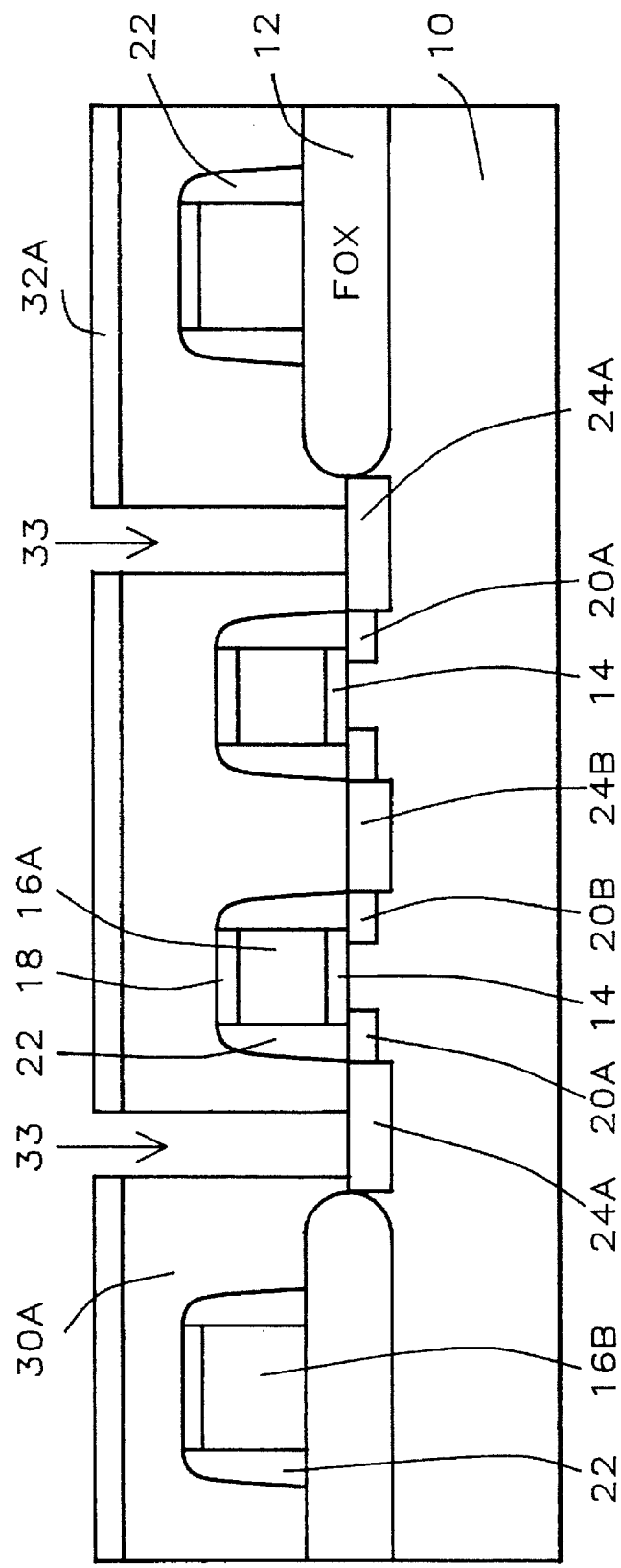
FIGS. 1 through 11 are cross sectional views for illustrating a method for manufacturing the stacked capacitor having a double wall crown shape according to the present invention.

As shown in FIG. 1, the method for fabricating a capacitor begins by providing a substrate having a field oxide layer 12 and MOS field effect transistor (FET) devices formed thereon. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming these regions is described by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in the range between about 4000 and 6000 Å.

The semiconductor field effect transistor (FET) device is then formed in the active device area. The most commonly used device for dynamic random access memories (DRAM) are metal oxide semiconductor field effect transistors (MOSFET's). The formation of the field effect transistors and word lines 16B shown in FIG. 1 will be describe next. A gate oxide layer 14 is formed, typically by thermal oxidation of the silicon substrate, with a thickness between about 75 and 120 Å. An appropriately doped polysilicon layer, and an insulating layer are deposited on substrate 10 and conventional photolithographic techniques are used to pattern these layers to form the gate electrodes 16A, word lines 16B, and a cap layer 18. The gates are formed on the substrate disposed between the field oxide regions 12. The gates on the substrate form the gate electrodes 16A of the MOSFET's in the active device areas. The gates formed over the field oxide 12 form word lines 16B that electrically connect the MOSFET gate electrode to the appropriate peripheral circuits on the DRAM chip.

The lightly doped source/drain 20A 20B of the N-channel MOSFET are formed next, usually by implanting an N-type atomic species, such as arsenic or phosphorus through the spaces between the gate electrodes 14 16A 18. For example, a typical implant might consist of phosphorus P31 at a dose of between about 1E13 to 1E14 atoms/cm$^2$ and at an energy between about 30 to 80 Kev.

After forming the lightly doped source/drains 20A 20B, sidewall spacers 22 are formed on the gate electrode 14 16A 18 sidewalls. These sidewall spacers 22 are preferably formed by depositing a low temperature silicon oxide and anisotropically etching back to the silicon surface. For example, the silicon oxide could be formed by a chemical vapor deposition using tetraethoxysilane (TEOS) at a temperature in the range of about 650° to 900° C. and the etch back preferably is performed in a low pressure reactive ion etcher with a fluorine gas, such as $C_2F_6$ (carbon hexafluoride) or $CF_4+H_2$ (carbon tetrafluoride and hydrogen).

The source/drain 24A 24B regions of the MOSFET are now implanted between the spacers 22 with a N type atomic species, for example, arsenic (As75), to complete the source/drain (i.e., the source is the node contact) 24A 24B. As shown in FIG. 1, the source 24A is can be formed between the gate 16A and the field oxide 12. The implantation is usually done through a thin layer of silicon oxide of about 200 to 300 Å in thickness to minimize implant channeling and to protect against contamination by metals and other impurities. A typical implantation dose is between 2E15 to 1E16 atoms/cm$^2$ and a typical energy is between about 20 to 70 Kev.

As shown in FIG. 1, a first insulation layer 30A is formed over the resultant surface. The insulating layer 30A is preferably formed of silicon oxide or silicon nitride. The insulating layer 30A is more preferably composed of a doped or undoped silicon oxide, such as a TEOS oxide, borophosphosilicate glass (BPSG) or phosphosilicate glass (PSG). Layer 30A preferably has a thickness in the range between about 5000 and 10000 Å.

Next, a barrier layer 32A is formed over the first insulation layer 30A. The barrier layer 32A is preferably formed of silicon oxide or silicon nitride. The barrier layer is more preferably formed of a silicon nitride layer formed with a LPCVD process. The first barrier layer 32A preferably has a thickness in the range of between about 600 and 2000 Å.

Still referring to FIG. 1, a node contact opening 33 is etched in the barrier layer and the first insulation layer 30A exposing the source regions 24A in the substrate 10. A conventional photo process can be used to form the contact opening. The contact opening preferably has a circular or rectangular shape.

Figure 2:
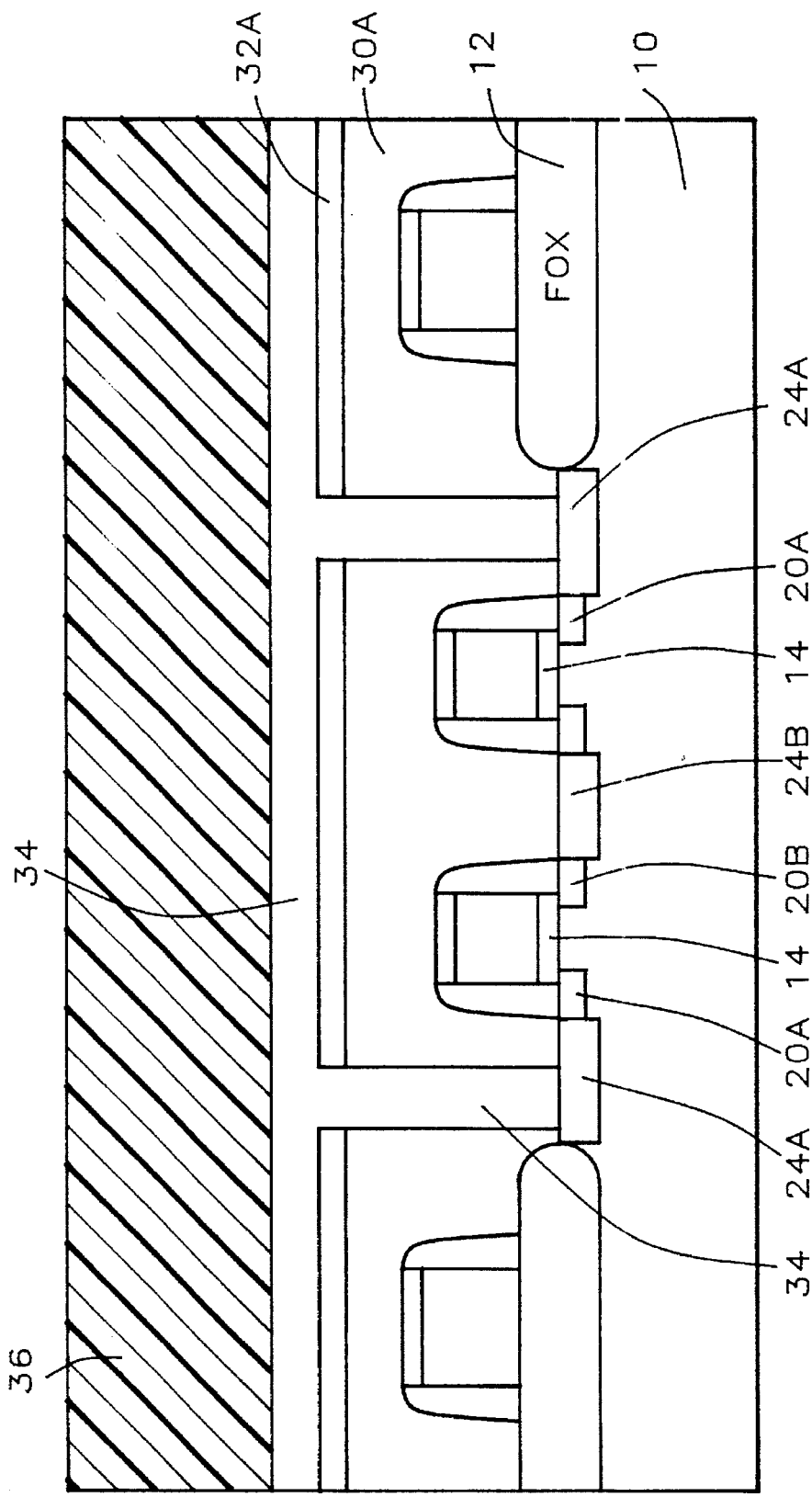

Turning to FIG. 2, a first conductive layer 34 is formed in the node contact opening 33 and covers the barrier layer 32A. The first conductive layer can be formed of polycide, (e.g., WSi) or doped polysilicon. The first conductive layer is preferably formed of polysilicon in situ doped with phosphorus and arsenic. The first conductive layer preferably has an impurity concentration in the range of between about 1E19 and 1E21 atoms/cm$^3$ and a thickness over the first insulating layer in the range of between about 1000 and 3000 Å.

Still referring to FIG. 2, a masking layer 36 is formed over the first conductive layer 34. The masking layer 36 is preferably formed of a material selected from the group consisting of silicon oxide and silicon nitride. The masking layer 36 is more preferably formed of silicon dioxide. The masking layer 36 preferably has a thickness in the range of between about 4000 and 8000 Å.

In a first embodiment of the present invention, the barrier layer 32A is composed of silicon nitride, and the masking layer 36 and the dielectric spacers 40A are composed of silicon oxide. In a second embodiment of the present invention, the barrier layer 32A is composed of silicon oxide, and the masking layer 36 and the dielectric spacers 40A are composed of silicon nitride.

Figure 3:
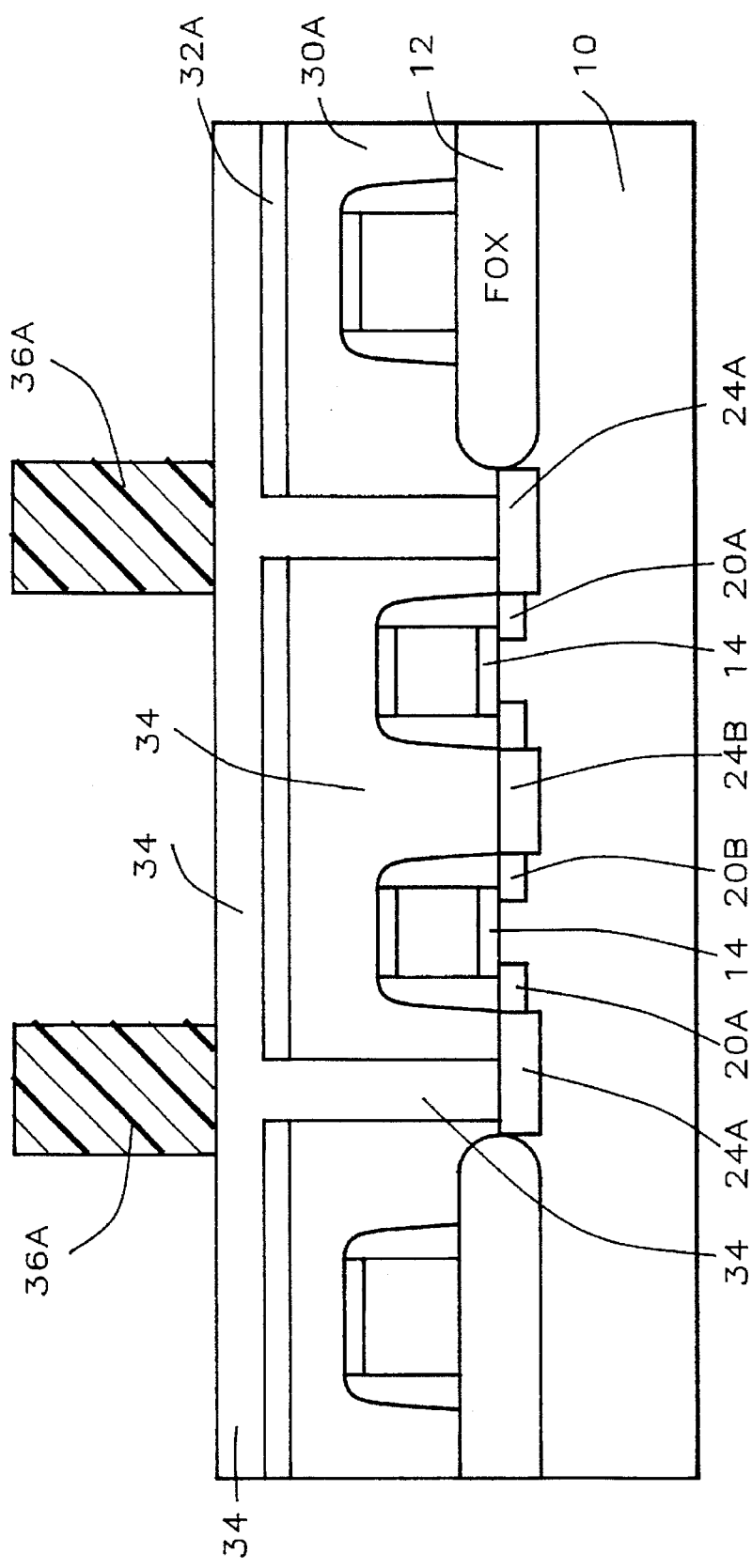

As shown in FIG. 3 the masking layer 36 is patterned and etched using a conventional photolithographic technique thereby forming a masking block (masking cylinder) 36A over at least the node contact hole 33. The masking block can have any shape and preferably has a cylindrical or rectangular shape. The masking block (masking cylinder) 36A preferably has a cylindrical shape and a height in the range of between about 4000 and 8000 Å.

Figure 4:
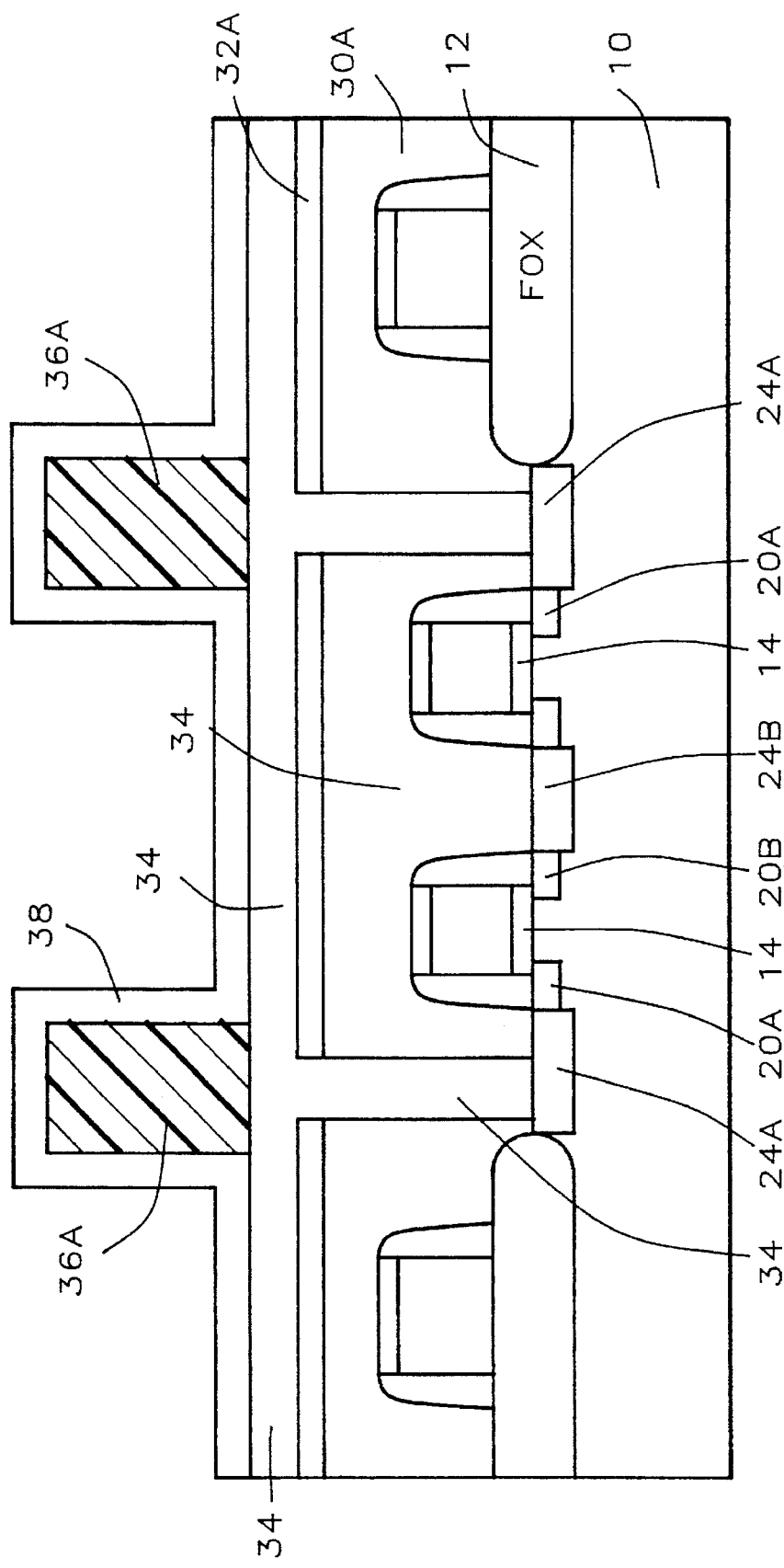

As shown in FIG. 4, a second conductive layer 38 (in situ doped polysilicon) is formed over the surfaces of the masking block and the first conductive layer 34. The second conductive layer can be formed of: doped polysilicon, and polycide, such as tungsten silicide. The second conductive layer is more preferably formed of polysilicon doped in situ with: phosphorus or arsenic. The second conductive layer 38 preferably has an impurity concentration in the range of between about 1E19 and 1E21 atoms/cm$^3$ and a thickness in the range of between about 800 and 2500 Å.

Figure 5:
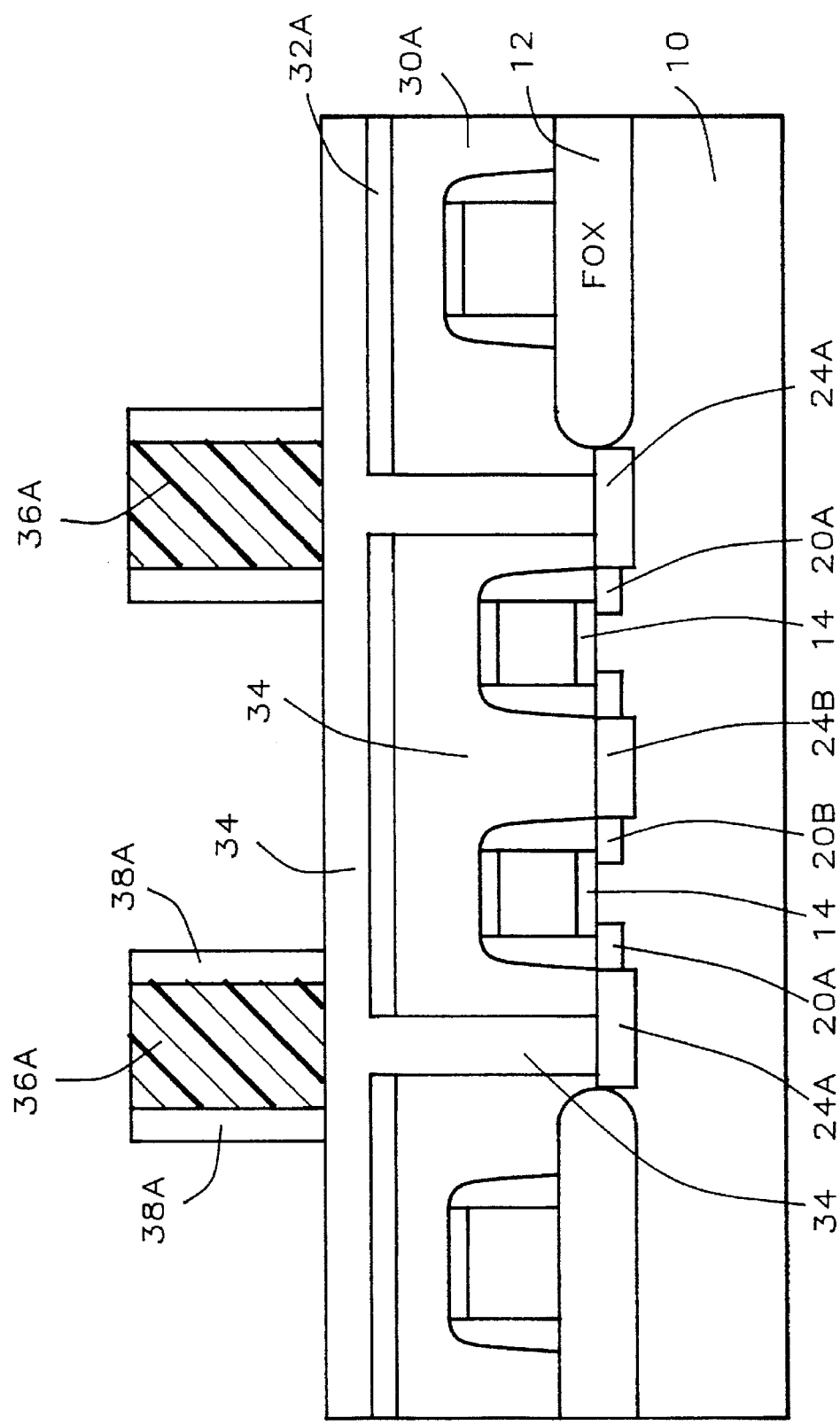

Referring to FIG. 5, the second conductive layer 38 is anisotropically etched back forming first conductive spacers 38A on the sidewalls of the masking block (cylinder) 36A.

Figure 6:
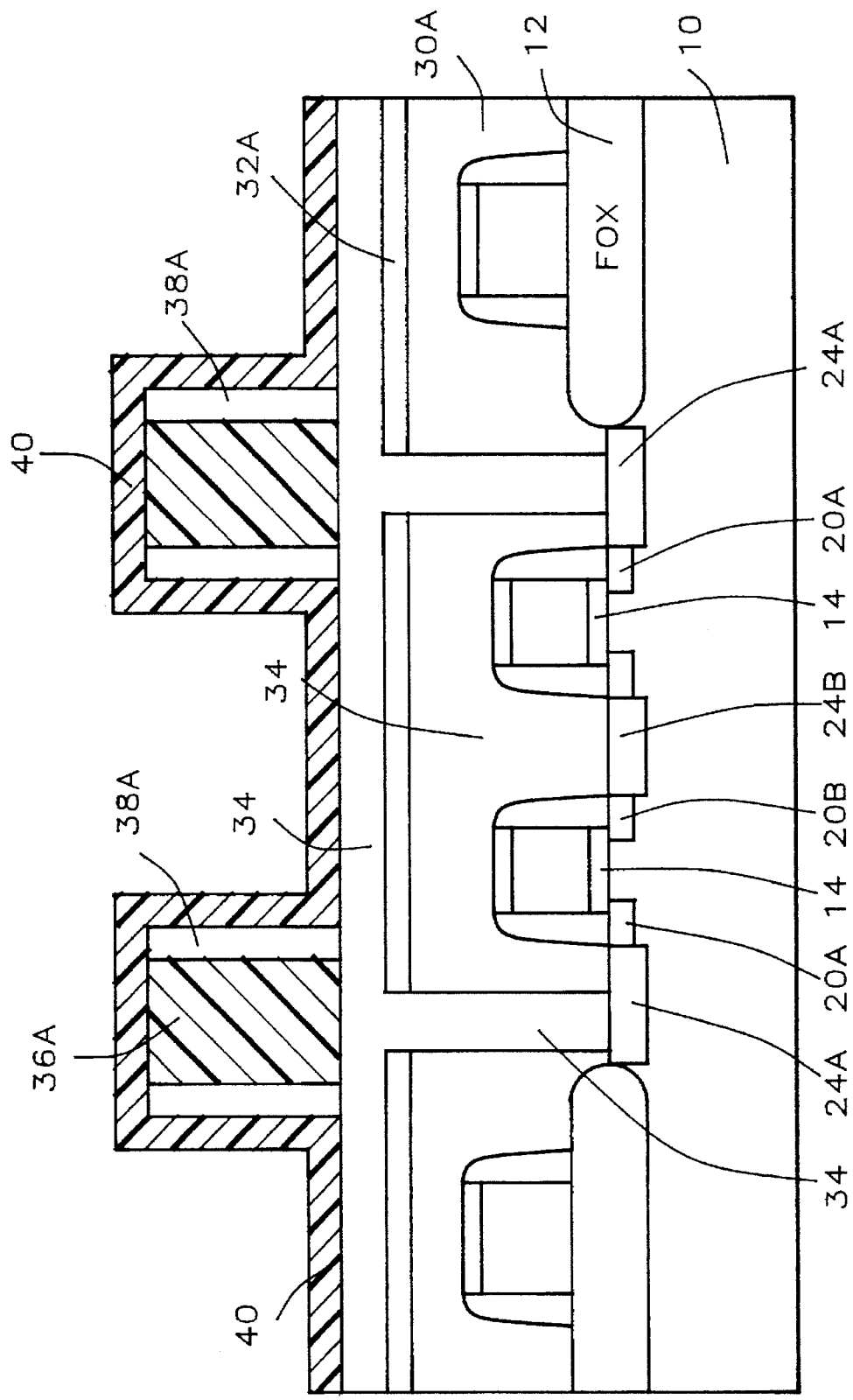

As shown in FIG. 6, a dielectric layer 40 is then formed over the resultant surface. The dielectric layer preferably has a thickness in the range of between about 800 and 2500 Å. The dielectric spacers 38A and the masking block 36A are formed of a material that has different etch properties than the conductive spacers 38A so that the dielectric spacers 38a and the masking block 36A can be selectively removed without etching the conductive spacers. The dielectric layer preferably is formed of a material selected from the group consisting of: silicon oxide and silicon nitride. The dielectric layer is more preferably formed of silicon oxide.

Figure 7:
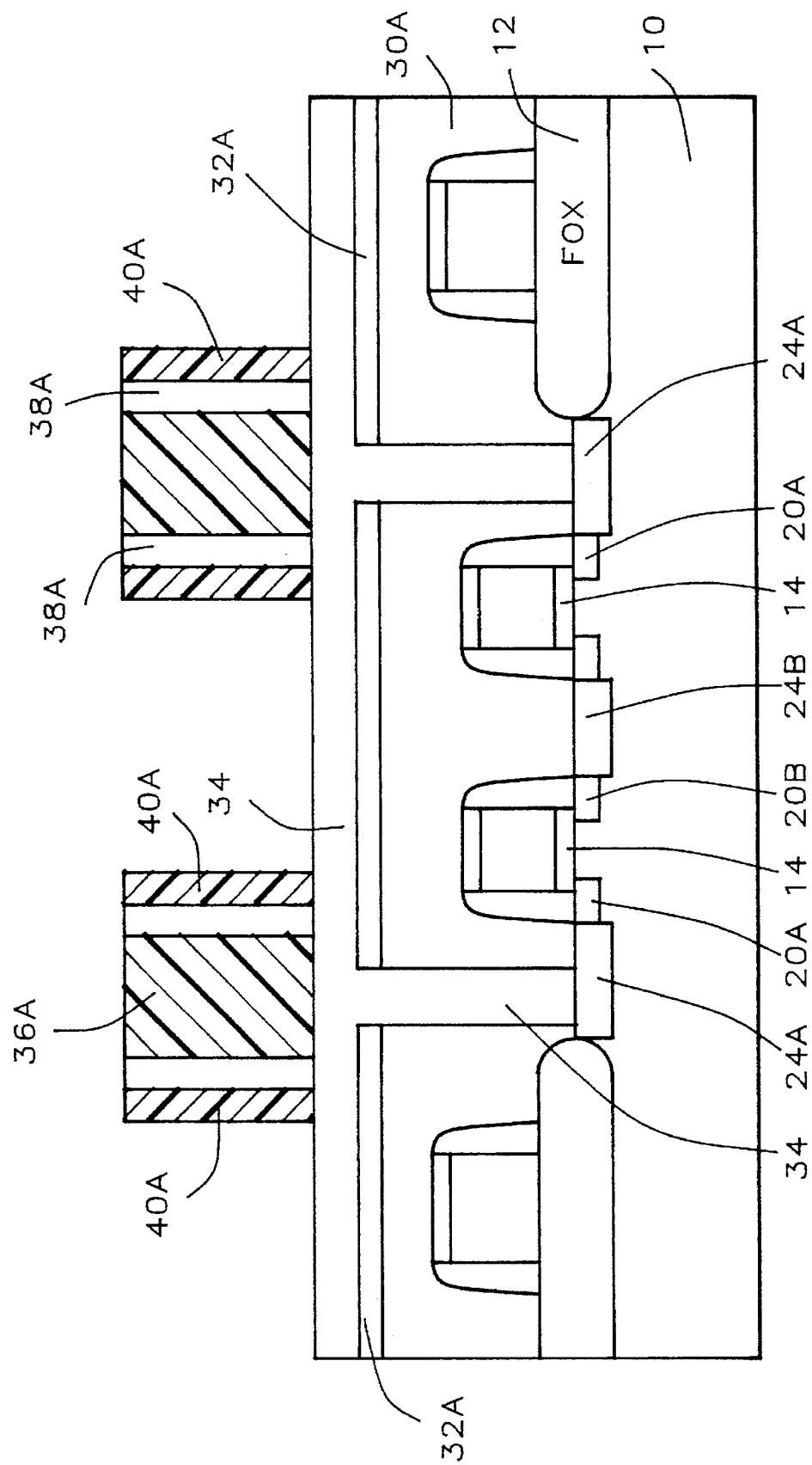

As shown in FIG. 7, the dielectric layer (e.g., third nitride layer) 40 is anisotropically etched forming dielectric spacers (nitride spacers) 40A on the sidewalls of the first conductive spacers 38A.

Figure 8:
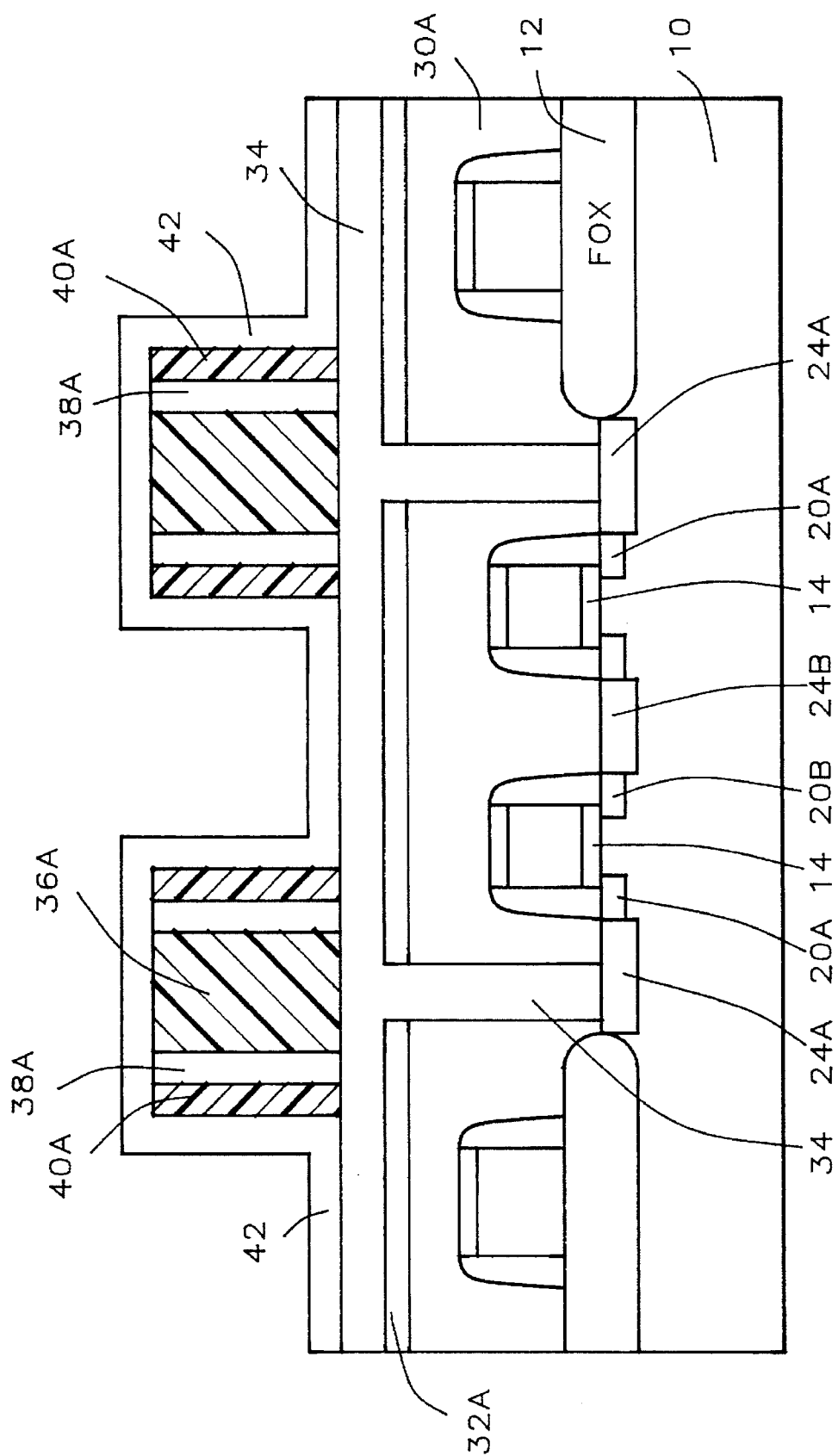

FIG. 8 shows a third conductive layer 42 formed over the resultant surface. The third conductive layer 42 preferably has a thickness over the first insulating layer in the range of between about 800 and 2500 Å. The third conductive layer is preferably formed of polysilicon, or a polycide. The third conductive layer 42 is preferably formed of polysilicon doped with phosphorus or arsenic. The third conductive layer has an impurity concentration in the range of between about 1E19 and 1E21 atoms/cm$^3$.

Figure 9:
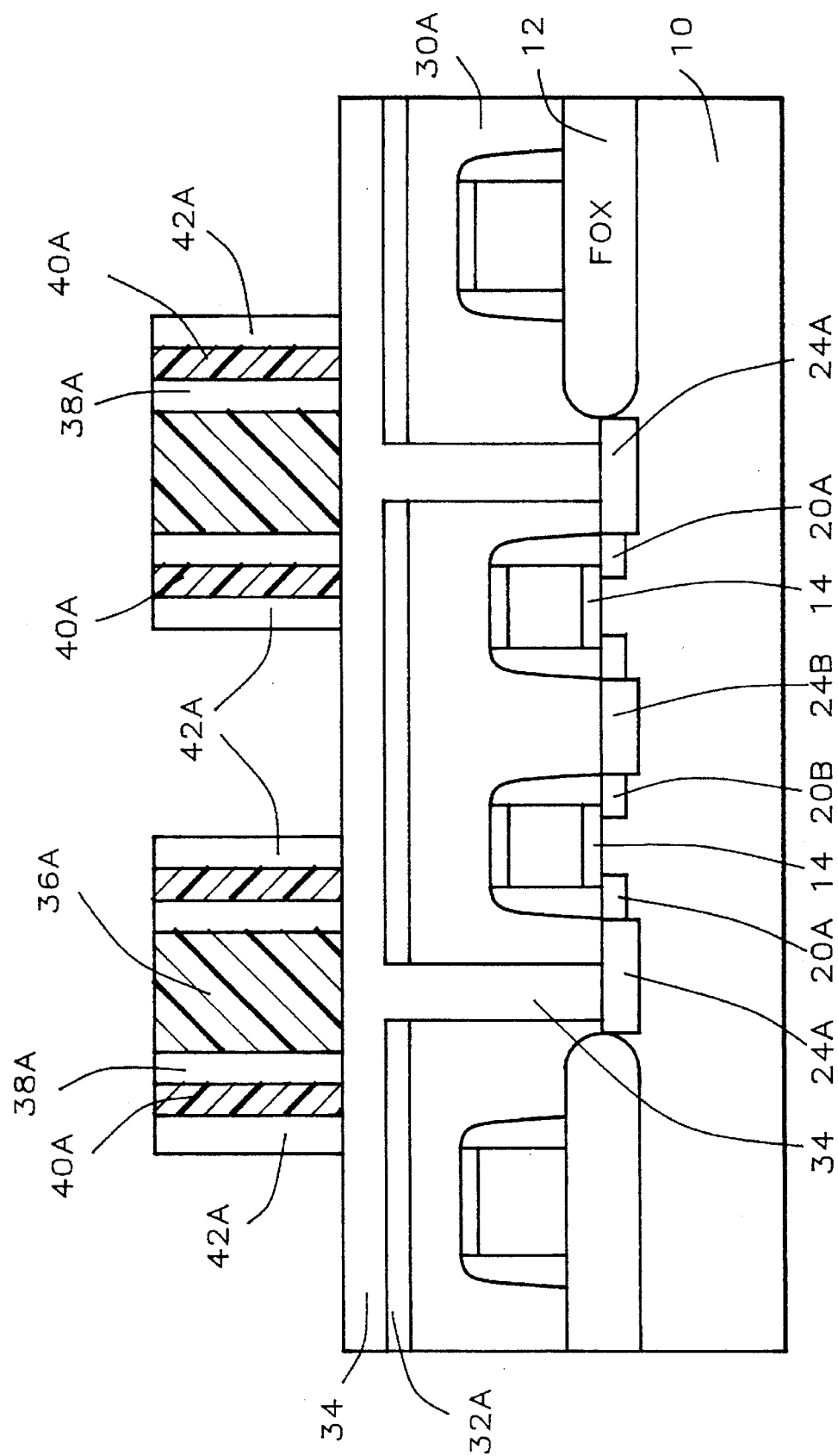

Turning to FIG. 9, the third conductive layer 42 is anisotropically etched forming second conductive spacers 42A on the sidewalls of the dielectric spacers 40A. The second conductive spacers 42A are formed of doped polysilicon and have a thickness in the range of between about 800 and 2500 Å and a height of between about 4000 and 8000 Å.

Figure 10:
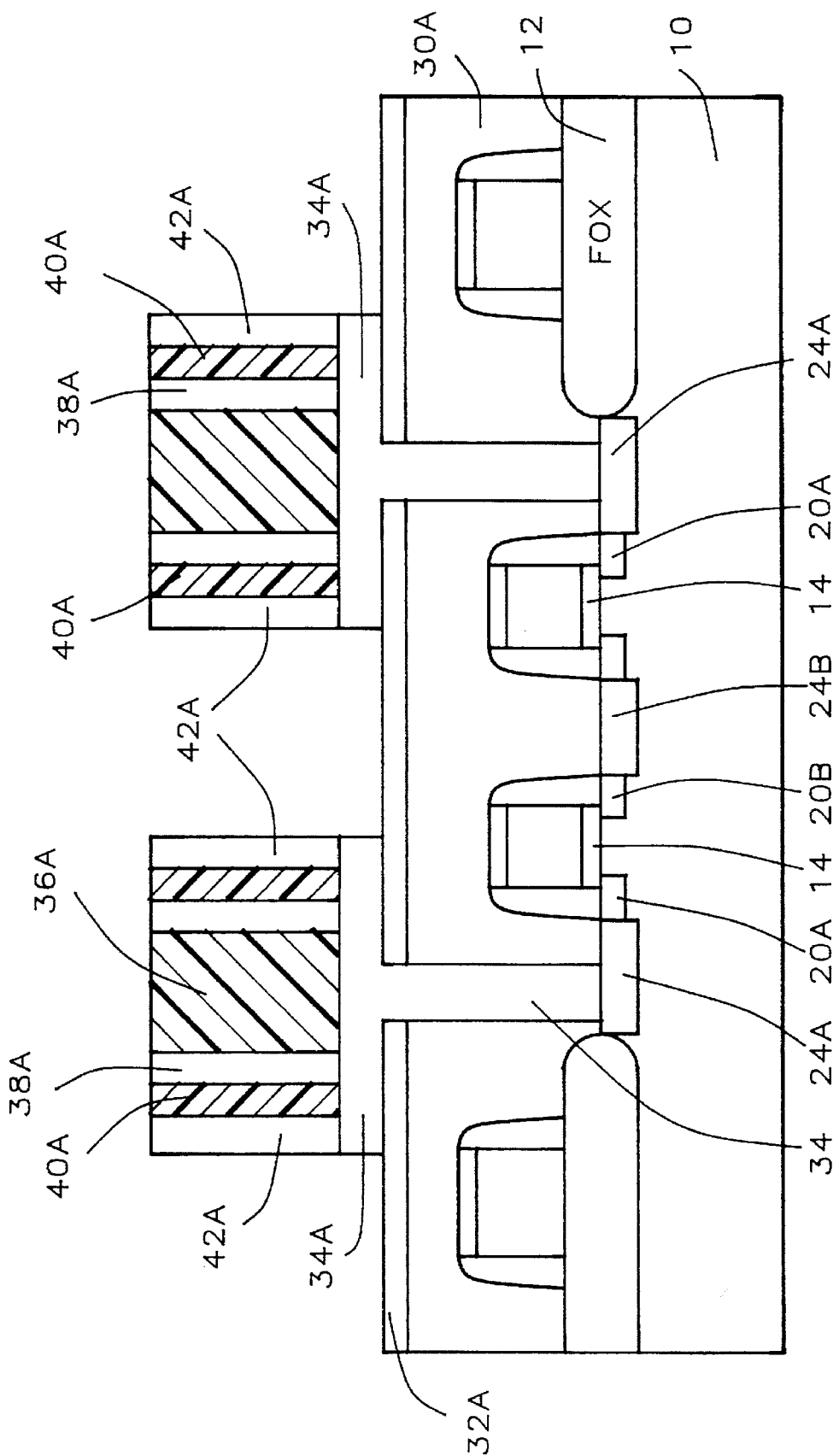

As shown in FIG. 10, the first conductive layer 34 is anisotropically etched using the cylinder block 36A, first conductive spacers 38A and the dielectric spacers (40A and second conductive spacers 42A as a mask. The first conductive layer 34 is preferably etched with a chlorine containing gas mixture such as Cl$_2$ and HBr.

The cylinder block 36A and the dielectric spacers 40A are then removed using a selective etch thereby forming a bottom electrode 34A 38A 42A. The selective etch is preferably a diluted HF etch.

Figure 11:
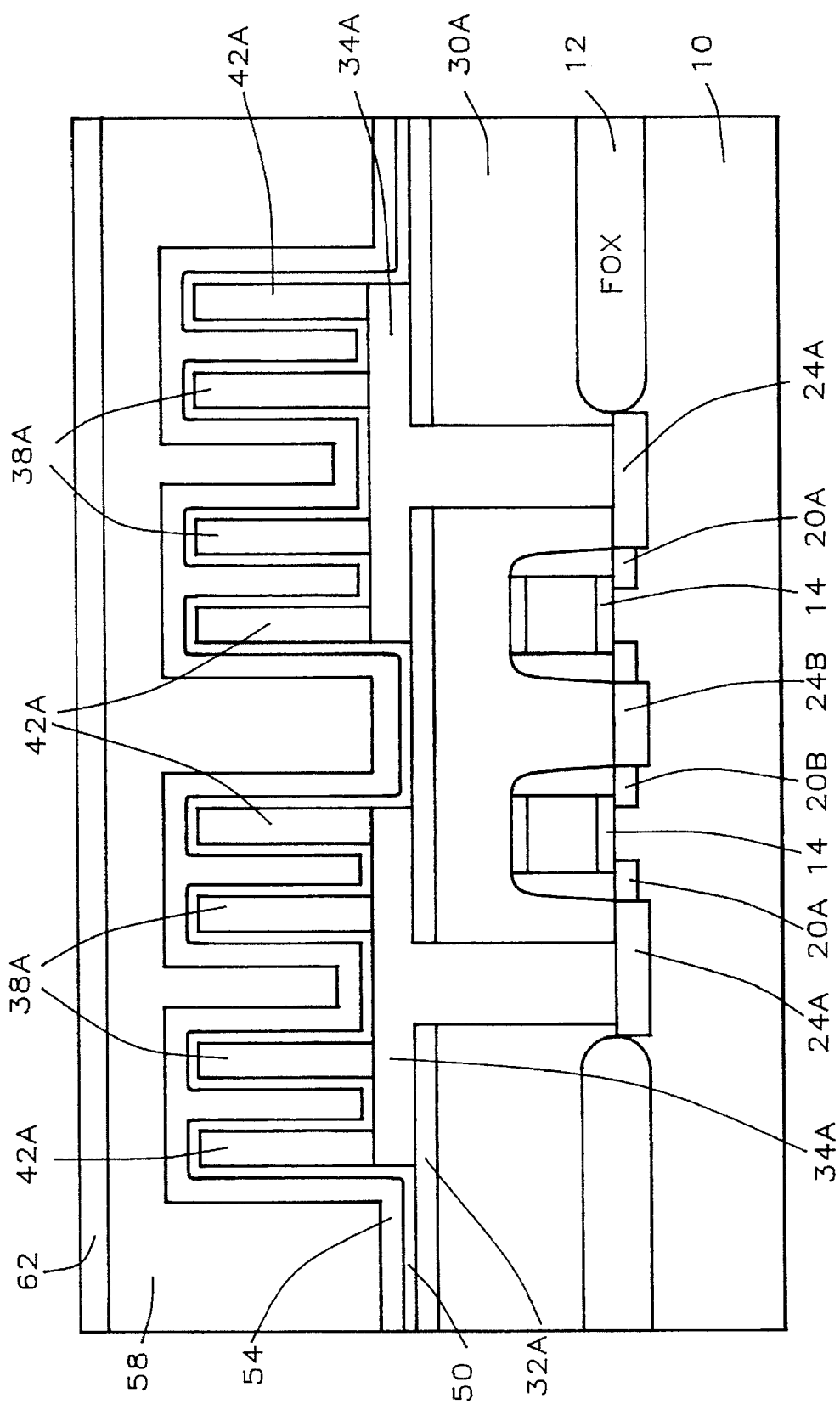

As shown in FIG. 11, a capacitor dielectric layer 50 is formed over the storage electrode 34A 42A 38A. The capacitor dielectric layer 50 is preferably composed of: a three layer structure of silicon oxide/silicon nitride/silicon oxide (ONO), a two layer structure of silicon oxide/silicon nitride (ON), or silicon nitride. The capacitor dielectric layer 50 more preferably formed of ONO and preferably has an overall thickness in the range of between about 80 and 250 Å.

A preferred dielectric is formed of a three layer structure of oxide/nitride/oxide (ONO) to a total thickness of between about 80 and 250 Å. The bottom oxide is formed by exposure in DI water to a thickness of between about 20 and 40 Å. The middle nitride is formed by LPCVD at a temperature of about 760° C., a pressure of 350 mtorr, in NH$_3$ (ammonia) and SiH$_4$ (silane), to a thickness of between about 20 and 50 Å. The top oxide is formed by oxidation in a dry oxygen ambient, at a temperature of about 850° C. for about 30 minutes.

A top plate electrode 54 is formed over the capacitor dielectric layer 50 to form the capacitor and the DRAM cell. The top plate electrode is preferably formed of an in situ doped polysilicon layer with a thickness preferably in the range between about 1000 and 2000 Å. Next, insulating layers 38A and metal lines 62 are formed to complete the circuits of the DRAM cell. Also, other structures, such as bit lines and bit line contacts, can be formed anytime during the process to complete the DRAM cell.

The process of the current invention provides a high capacitance and dense capacitor which eliminates several photo steps by using sidewall spacers and a selective etch. The two walls 38A 42A in the bottom electrode increase the surface area and therefore the capacitance. The process is simple to manufacture. The spacers allow tight dimensional process control and further device miniaturization.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a stacked capacitor having a double wall crown shape, comprising the steps of:
   a) forming a first insulating layer over a substrate;
   b) forming a barrier layer over said first insulation layer;
   c) etching a node contact opening through said barrier layer and said first insulation layer exposing said substrate;
   d) forming a first conductive layer filling said node contact opening and covering said barrier layer;
   e) forming a masking block over at least said node contact opening, said masking block having sidewalls;
   f) forming first conductive spacers on said sidewalls of said masking block, said first conductive spacers having sidewalls;
   g) forming dielectric spacers on said sidewalls of said first conductive spacers, said dielectric spacers having sidewalls;
   h) forming second conductive spacers on the sidewalls of said dielectric spacers, said second conductive spacers having sidewalls;
   i) anisotropically etching said first conductive layer using said masking block, first conductive spacers, said dielectric spacers and said second conductive spacers as a mask;
   j) selectively removing said masking block and said dielectric spacers, thereby forming a bottom electrode;
   k) forming a capacitor dielectric layer over said bottom electrode; and
   l) forming a top plate electrode over said capacitor dielectric layer to form said stacked capacitor.

2. The method of claim 1 wherein said substrate includes a MOS (metal oxide semiconductor) device having a gate electrode, source and drain regions, adjacent to a field oxide region in said substrate, and a word line over said field oxide region.

3. The method of claim 1 wherein said barrier layer is composed of silicon nitride and said masking block is composed of silicon oxide and said dielectric spacers are composed of silicon oxide.

4. The method of claim 1 wherein said barrier layer is composed of silicon oxide and said masking block is composed of silicon nitride and said dielectric spacers are composed of silicon nitride.

5. The method of claim 1 wherein said first insulating layer is formed of a material selected from the group consisting of silicon nitride and silicon oxide.

6. The method of claim 1 wherein said barrier layer is formed of a material selected from the group consisting of silicon oxide and silicon nitride.

7. The method of claim 1 wherein said first conductive layer is formed of polysilicon doped with an impurity selected from the group consisting of phosphorus and arsenic, and said first conductive layer has an impurity concentration in the range of between about 1E19 and 1E21 atoms/cm$^3$ and a thickness over said first insulating layer in the range of between about 1000 and 3000 Å.

8. The method of claim 1 wherein said masking layer is formed of a material selected from the group consisting of silicon oxide and silicon nitride, and has a thickness in the range of between about 4000 and 8000 Å.

9. The method of claim 1 wherein said masking block has a cylindrical shape and a height in the range of between about 4000 and 8000 Å.

10. The method of claim 1 wherein first conductive spacers are formed of a material selected from the group consisting of: doped polysilicon and polycide, and have a thickness in the range of between about 800 and 2500 Å.

11. The method of claim 1 wherein said dielectric spacers have a thickness in the range of between about 800 and 2500 Å and are formed of a material selected from the group consisting of silicon oxide and silicon nitride.

12. The method of claim 1 wherein said second conductive spacers are formed of a material selected from the group consisting of polysilicon and polycide, and have a height of between about 4000 and 8000 Å, and have a thickness in the range of between about 800 and 2500 Å.

13. The method of claim 1 wherein said capacitor dielectric layer is composed of a material selected from the group consisting of a three layer structure of silicon oxide/silicon nitride/silicon oxide (ONO), a two layer structure of silicon oxide/silicon nitride (ON), and silicon nitride, and said capacitor dielectric layer having a thickness in the range of between about 80 and 250 Å.

14. A method of fabrication of dynamic random access memory (DRAM) cell having a stacked capacitor with a double wall crown shape, comprising the steps of
   a) providing a MOS (metal oxide semiconductor) device having a gate electrode, source and drain regions adjacent to a field oxide region in a substrate, a conductive word line formed over said field oxide region;
   b) forming first insulating layer over the resultant surface;
   c) forming a barrier layer over said first insulation layer;
   d) etching a node contact opening through said barrier layer and said first insulation layer exposing said source region in said substrate;
   e) forming a first conductive layer in said node contact opening and covering said barrier layer;
   f) forming a masking layer over said first conductive layer;
   g) etching said masking layer forming a masking block over at least said node contact hole;
   h) forming a second conductive layer over the surfaces of said masking block and said first conductive layer;
   i) anisotropically etching said second conductive layer forming first conductive spacers on the sidewalls of said masking block, said first conductive spacers having sidewalls;
   j) forming a dielectric layer over at least said masking block and said first conductive spacers;
   k) anisotropically etching said dielectric layer forming dielectric spacers on the sidewalls of said first conductive spacers, said dielectric spacers having sidewalls;
   l) forming a third conductive layer over at least said masking block, said first conductive spacers, and said dielectric spacers;
   m) anisotropically etching said third conductive layer forming second conductive spacers on the sidewalls of said dielectric spacers;
   n) anisotropically etching said first conductive layer using said masking block, first conductive spacers, said dielectric spacers and said second conductive spacers as a mask, thereby exposing said barrier layer;
   o) removing said masking block, and said dielectric spacers, thereby forming a bottom electrode;

p) forming a capacitor dielectric layer over said bottom electrode;

q) forming a top plate electrode over said capacitor dielectric layer to form said stacked capacitor; and r) forming an insulating layer and metal lines over said stacked capacitor to complete said DRAM cell.

15. The method of claim 14 wherein said barrier layer is composed of silicon nitride and said masking block is composed of silicon oxide and said dielectric spacers are composed of silicon oxide.

16. The method of claim 14 wherein said barrier layer is composed of silicon oxide and said masking block is composed of silicon nitride and said dielectric spacers are composed of silicon nitride.

17. The method of claim 14 wherein said first insulating layer is formed of a material selected from the group consisting of: silicon nitride and silicon oxide.

18. The method of claim 14 wherein said first conductive layer is formed of polysilicon doped with an impurity selected from the group consisting of phosphorus and arsenic, and said first conductive layer has an impurity concentration in the range of between about 1E19 and 1E21 atoms/cm$^3$ and a thickness over said first insulating layer in the range of between about 1000 and 3000 Å.

19. The method of claim 14 wherein said masking block has a cylindrical shape and a height in the range of between about 4000 and 8000 Å.

20. The method of claim 14 wherein said dielectric spacers have a thickness in the range of between about 800 and 2500 Å and are formed of a material selected from the group consisting of: silicon oxide and silicon nitride.

21. The method of claim 14 wherein said first and second conductive spacers are formed of a material selected from the group consisting of polysilicon and polycide, and have a height of between about 4000 and 8000 Å, and have a thickness in the range of between about 800 and 2500 Å.

22. A method of fabricating a stacked capacitor having a double walled cylindrical, shape, comprising the steps of:

a) forming first insulating layer over a substrate;

b) forming a barrier layer composed of silicon oxide over said first insulation layer;

c) etching a node contact opening through said barrier layer and said first insulation layer exposing said substrate;

d) forming a first conductive layer of polysilicon filling said node contact opening and covering said barrier layer; said first conductive layer is formed of polysilicon doped with an impurity selected from the group consisting of phosphorus and arsenic, and said first conductive layer has an impurity concentration in a range of between about 1E19 and 1E21 atoms/cm$^3$ and a thickness over said first insulating layer in a range of between about 1000 and 3000 Å;

e) forming a masking layer composed of silicon nitride over said first conductive layer;

f) patterning said masking layer forming a masking block over at least said node contact hole; said masking block has a cylindrical shape and a height in a range of between about 4000 and 8000 Å;

g) forming a second conductive layer of in situ doped polysilicon over the surfaces of said masking block and said first conductive layer;

h) anisotropically etching said second conductive layer forming first conductive spacers on the sidewalls of said masking block; said first conductive spacers are formed of a material selected from the group consisting of polysilicon and polycide, and have a height of between about 4000 and 8000 Å, and have a thickness in the range of between about 800 and 2500 Å;

i) forming a dielectric layer composed of silicon nitride over at least said masking block and said first conductive spacers;

j) anisotropically etching said dielectric layer forming dielectric spacers on the sidewalls of said first conductive spacers, said dielectric spacers having sidewalls; said dielectric spacers having a thickness in a range of between about 800 and 2500 Å;

k) forming a third conductive layer composed of polysilicon over at least said masking block, said first conductive spacers and said dielectric spacers;

l) anisotropically etching said third conductive layer forming second conductive spacers on the sidewalls of said dielectric spacers, said second conductive spacers having sidewalls; said second conductive spacers are formed of a material selected from the group consisting of polysilicon and polycide, and have a height of between about 4000 and 8000 Å, and have a thickness in a range of between about 800 and 2500 Å;

m) anisotropically etching said first conductive layer using said cylinder block, first conductive spacers, said dielectric spacers and said second conductive spaces as a mask thereby exposing said barrier layer;

n) selectively removing said masking block, and said dielectric spacers, thereby forming a bottom electrode;

o) forming a capacitor dielectric layer over said bottom electrode; and p) forming a top plate electrode over said capacitor dielectric layer to form said stacked capacitor.

23. The method of claim 22 wherein said first insulating layer is formed of a material selected from the group consisting of: silicon nitride and silicon oxide.

* * * * *